United States Patent
Nogami et al.

[11] Patent Number: 6,059,940
[45] Date of Patent: May 9, 2000

[54] METHOD FOR FABRICATING DUAL LAYER PROTECTIVE BARRIER COPPER METALLIZATION

[75] Inventors: Takeshi Nogami, Sunnyvale; Dirk Brown, Santa Clara, both of Calif.

[73] Assignee: Advanced Micro Devices, Inc., Sunnyvale, Calif.

[21] Appl. No.: 09/205,583

[22] Filed: Dec. 4, 1998

[51] Int. Cl.[7] .................................................. C23C 14/34
[52] U.S. Cl. .............................. 204/192.15; 204/192.22; 204/192.25; 204/192.23; 204/298.07; 204/298.11; 427/304; 438/637; 438/775
[58] Field of Search .................... 204/192.12, 192.22, 204/192.14, 192.15, 192.17, 192.23, 192.25, 298.07, 298.11; 427/304, 305; 438/618, 631, 635, 637, 769, 775

[56] References Cited

U.S. PATENT DOCUMENTS

| | | | |
|---|---|---|---|
| 4,377,438 | 3/1983 | Moriya et al. | 438/699 |
| 5,358,615 | 10/1994 | Grant et al. | 204/192.15 |
| 5,622,607 | 4/1997 | Yamazaki et al. | 204/192.15 |

OTHER PUBLICATIONS

Steinbruchel, C. Patterning of copper for multilevel metallization: reactive ion etching and chemical–mechanical polishin. Applied Surface Science 91, vol. 91, pp. 139–146, Apr. 4, 1995.

Bai, G. et al. Copper Interconnection Deposition Techniques and Integration. 1996 Symposium on VLSI Technology Digest of Technical Papers, pp. 48–49, 1996.

*Primary Examiner*—Nam Nguyen
*Assistant Examiner*—Julian A. Mercado

[57] ABSTRACT

Copper or copper alloy interconnection patterns are formed with improved barrier layer protection against copper diffusion. A damascene opening is formed in a dielectric layer and a barrier layer is deposited lining the damascene opening and on the dielectric layer. Embodiments include forming a nitride barrier layer with a plasma generated in a chamber containing a shutter which prevents sputtered atoms from impinging on the dielectric layer. The shutter is then opened to allow a metal layer, e.g., Al, Mg or an alloy thereof, to be sputter deposited on the nitride layer in the chamber. Copper or a copper alloy is then deposited to fill the opening, as by electroplating or electroless plating.

16 Claims, 2 Drawing Sheets

METHOD FOR FABRICATING DUAL LAYER PROTECTIVE BARRIER COPPER METALLIZATION

TECHNICAL FIELD

The present invention relates to electroplated or electroless plated copper or copper alloy metallization. The present invention is applicable to manufacturing high speed integrated circuits having submicron design features and high conductivity reliable interconnect structures.

BACKGROUND ART

Aluminum (Al) and Al alloys are traditional metal interconnect metallurgies. While Al-based metallurgies have been the material of choice as metal interconnects in the past, concerns exist as to whether Al will meet the demands required as circuit density and speeds for semiconductor devices increase.

Copper (Cu) and Cu alloys have received considerable attention as a candidate for replacing Al in interconnect metallizations. Cu exhibits superior electromigration properties and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electro deposition of an adherent metallic coating on an electrode employing externally supplied electrons to reduce metal ions in the plating solution.

There are disadvantages attendant upon the use of Cu or Cu alloys. For example, Cu is easily oxidized and vulnerable to corrosion. Unlike Al, Cu does not form a self-passivating oxide on its surface. Accordingly, corrosion of Cu is an important issue which requires resolution before Cu can be effectively utilized in many semiconductor device applications. Moreover, Cu readily diffuses through silicon dioxide, the typical dielectric interlayer material employed in the manufacture of semiconductor devices, into silicon elements and adversely affects device performance.

Due to Cu diffusion through dielectric interlayer materials, such as silicon dioxide, Cu interconnect structures must be encapsulated by a diffusion barrier layer. One approach to diffusion barrier layers is to form a hybrid barrier layer, as in Jain et al., Conference Proceedings VLSI XIII, 1998 Materials Research Society, 1998. The hybrid barrier layer is produced by exposing an inter-level dielectric to a nitrogen plasma to form a layer of nitrided $SiO_2$, and, thereafter, depositing a titanium nitride (TiN) layer by sequential thermal decomposition of metalorganic chemical vapor deposition (MOCVD) of a precursor followed by in-situ plasma densification of the film.

There exists a need for a cost effective, simplified processes enabling the formation of a protective barrier layer in Cu or Cu alloy interconnection patterns having substantially reduced or no Cu diffusion.

The present invention addresses and solves the problems attendant upon conventional multi-step, time-consuming and complicated processes for manufacturing semiconductor devices having a protective barrier layer in Cu metallization.

DISCLOSURE OF THE INVENTION

An advantage of the present invention is an efficient cost-effective method of manufacturing a semiconductor device having Cu or Cu alloy metallization without Cu diffusion.

Additional advantages of the present invention will be set forth in the description which follows and in part will become apparent to those having ordinary skill in the art upon examination of the following or may be learned from the practice of the present invention. The objects and advantages of the invention may be realized and obtained as particularly pointed out in the appended claims.

According to the present invention, the foregoing and other advantages are achieved in part by a method of manufacturing a semiconductor, which method comprises: forming an opening in a dielectric layer;

forming a nitride layer lining the opening and on the dielectric layer with a plasma generated in a chamber comprising a target while preventing atoms sputtered from the target from impinging on the dielectric layer; and, sputter depositing a metal nitride layer on the nitride layer in the chamber by permitting atoms sputtered from the target to impinge on the nitride layer.

Additional advantages of the present invention will become readily apparent to those skilled in this art from the following detailed description, wherein embodiments of the present invention are described simply by way of illustrating of the best mode contemplated in carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

As used throughout this application, the symbol "Cu" denotes elemental or substantially elemental Cu, or a Cu alloy, such as Cu containing minor amounts of tin (Sn), titanium (Ti), germanium (Ge), zinc (Zn) or magnesium (Mg).

DESCRIPTION OF THE INVENTION

The present invention addresses and solves problems stemming from conventional Cu metallization practices with a protective barrier layer. Such problems include costly and time-consuming steps limited by materials which require different deposition systems and apparatus.

The embodiments of the present invention for producing protective barrier layer Cu metallization are particularly applicable in conjunction with damascene techniques, wherein an opening is formed in a dielectric layer, such as a silicon oxide, e.g silicon dioxide. The present invention, however, is not limited to dielectric layers comprising silicon oxide, but can be employed in the context of various dielectric materials, such as low dielectric constant (K) materials, e.g., low K polymers.

Figure 1A:
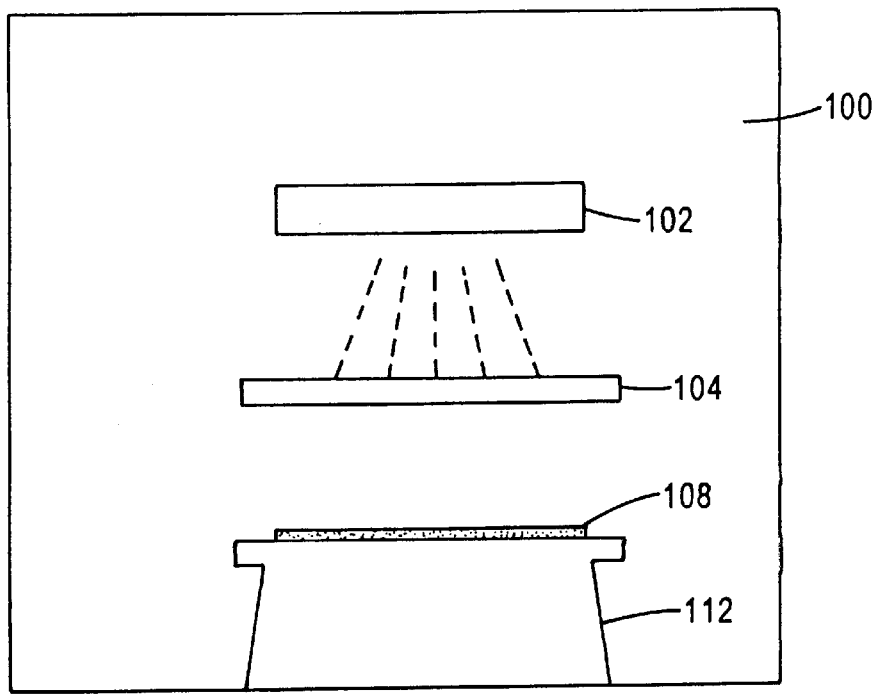
FIGS. 1A–1B schematically illustrate a chamber for practicing embodiments of the present invention.
Figure 1B:
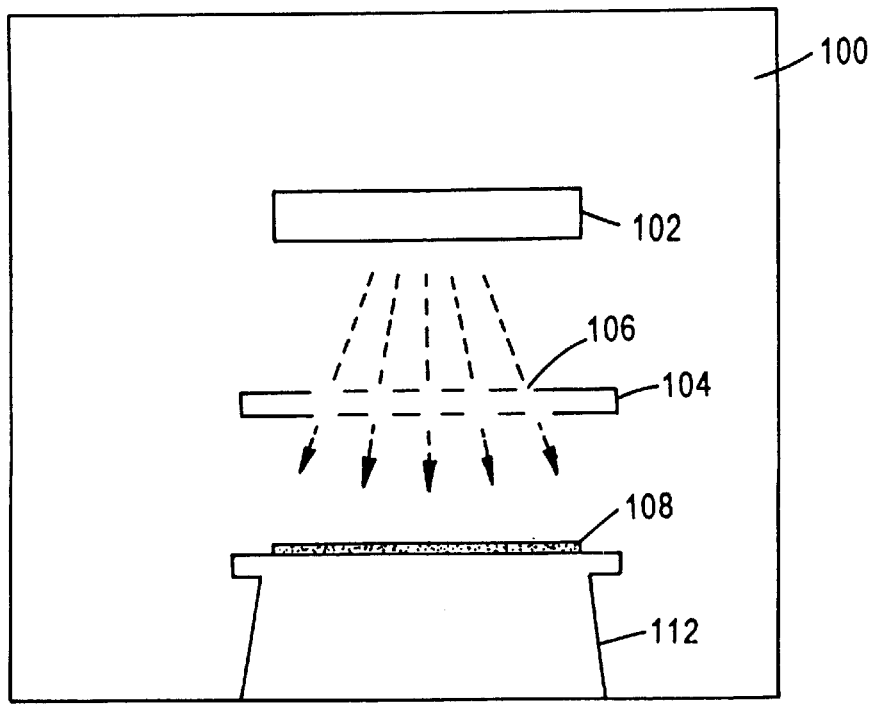

In practicing embodiments of the present invention, conventional depositing and etching techniques, conditions and equipment can be employed. For example, the nitride layer can be formed by physical vapor deposition (PVD) employing plasma which is generated from an inert mixture, e.g., argon, and nitrogen, in a chamber. Adverting to FIGS. 1A–1B, reference numeral 100 denotes a chamber, typically a sputtering chamber. A shutter 104 comprising an aperture (shown in FIG. 1B) is positioned in the chamber 100 between the wafer 108 containing an exposed dielectric layer having a damascene opening therein, and target 102 which rests upon pedestal 112. A plasma is then generated and sputtering initiated. However, since the aperture in shutter 104 is closed, atoms sputtered from the target 102 are prevented by the shutter from impinging on dielectric layer 108. When, silicon dioxide is exposed to nitrogen formed plasma, the resulting nitride layer can comprise silicon oxynitride, such as about 5% to about 40% silicon oxynitride. After the nitride layer is formed, the aperture 110 in the shutter 104 is opened, thereby permitting atoms sputtered from the target 102 to impinge on the nitride layer to form the metal layer thereon.

Figure 2A:
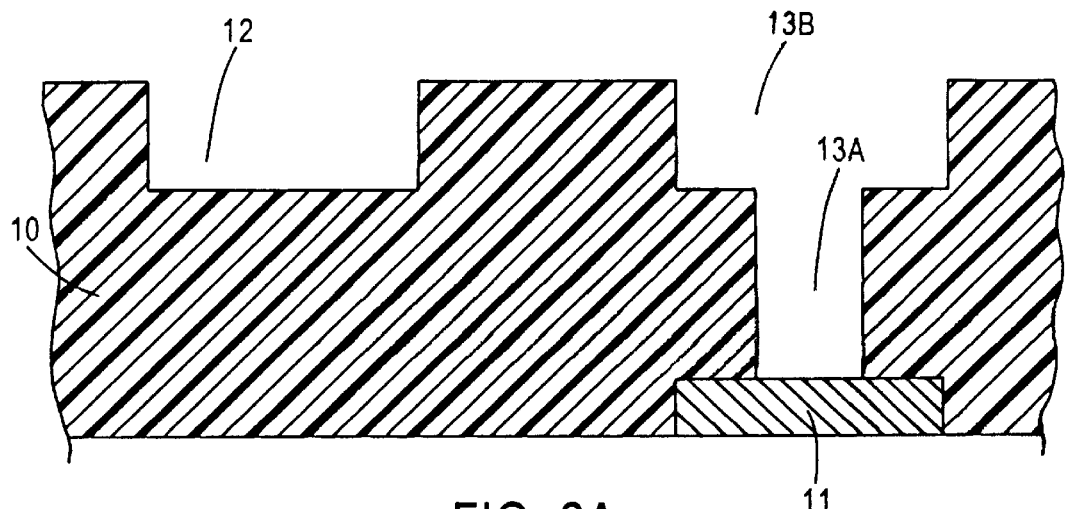
FIGS. 2A–2B schematically illustrates an embodiment of the present invention.
Figure 2B:
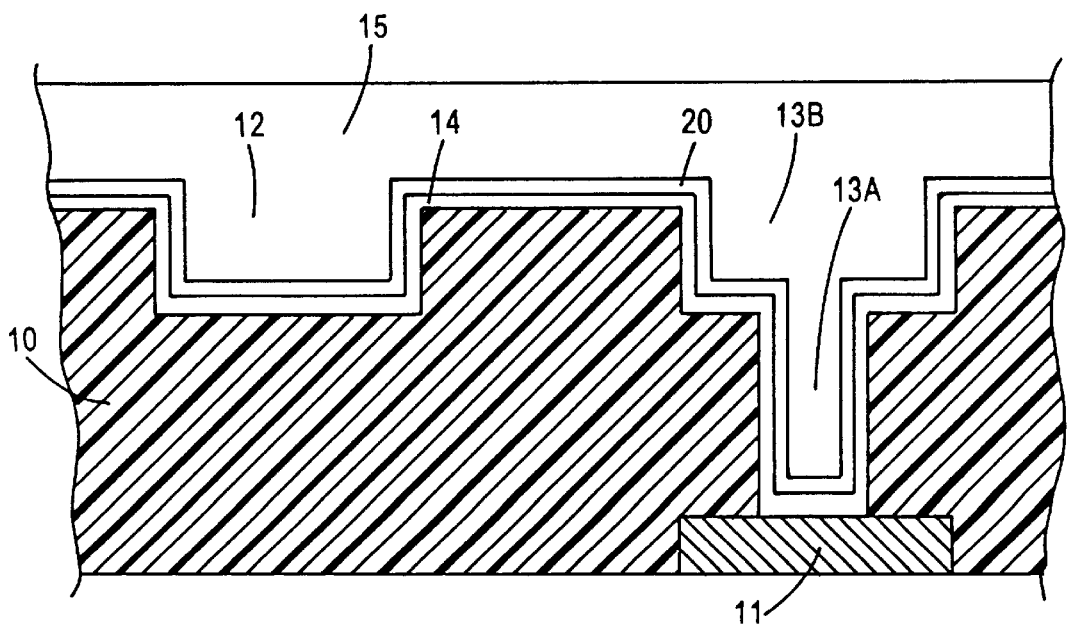

Given the present objectives and guidance of the present disclosure, the gas pressure, power, and other process parameters can be easily optimized in a particular situation, e.g., for a particular nitride, metal, and layer thickness. For example, it has been found suitable to employ a gas pressure of about 10 to about 50 milliTorr, such as about 15 milliTorr to about 40 milliTorr, and a DC power of about 100 W to about 500 W, such as about 200 W to about 400 W, and to deposit a Ta barrier layer having a thickness of about 50 Å to about 100 Å. Thus, an effective dual barrier layer is formed by an elegantly simplified, cost-effective technique of forming both layers of the protective barrier in the same chamber. An embodiment of the present invention is schematically illustrated in FIGS. 2A–2B. Adverting to FIG. 2A, damascene openings are etched in a conventional manner in a dielectric layer 10, typically comprising silicon dioxide. The damascene openings include a trench 12 and a dual damascene opening comprising via hole 13A in communication with trench 13B. As illustrated, via hole 13A communicates with an underlying interconnection line 11. However, the present invention is also applicable to a single damascene opening comprising a via hole, a single damascene opening comprising a contact hole or a dual damascene opening comprising a contact hole in communication with a trench.

With reference to FIG. 2B, after formation of the damascene opening or openings, Cu metallization having a protective double barrier layer is formed in a damascene opening in the dielectric layer 10. The wafer is placed in a chamber and a nitride layer 14 is formed lining the damascene openings and on the dielectric layer 10. The nitride layer 14 can comprise an oxynitride, preferably a silicon oxynitride and typically, the nitride layer 14 is deposited to a thickness less than about 5 nm, preferably less than about 3 nm. The nitride layer 14 is formed by introducing nitrogen gas into a chamber containing a sputtering arrangement. Sputtering is initiated; however, atoms sputtered from the target are prevented from impinging on the dielectric layer 10, as by positioning a closed aperatured shutter between the dielectric layer and target. In other words, ions generated in the plasma are accelerated towards the target and impinge on its surface. The sputtered material is prevented from depositing on the wafer which is placed facing the target.

With continued reference to FIG. 2B, the nitride layer 14 lines the damascene openings as well as the upper surface of dielectric layer 10. Thereafter, a metal layer 20 is sputter deposited on the surface of the nitride layer 14, as by opening the shutter aperture, thereby permitting atoms sputtered from the target to impinge on the nitride layer 14. Such a metal layer can comprise any of a variety of metals, such as tantalum (Ta), Ta nitride (TaN), Ta alloys, tungsten (W) or W alloys, and titanium (Ti), Ti alloys or TiN. Advantageous results have been achieved employing Ta, Ta alloys, W or W alloys. The metal layer can be formed to a thickness of about 25 Å to about 500 Å, preferably about 50 Å to about 100 Å. The resulting dual barrier layer comprises nitride layer 14 and metal layer 20, thereby providing effective protection against diffusion of Cu atoms from the Cu metallization through dielectric layer 10.

The damascene opening can be a trench, in which case the Cu metallization forms an interconnection line, or a via/contact hole in which case the Cu metallization forms a via/contact. Dual damascene techniques can be employed in which the opening contains a first portion forming a trench and a second portion forming a via/contact hole in communication with the trench, in which case the Cu metallization comprises a first section filling the trench and forming an interconnection line and a second portion filling the hole and forming a contact/via with the interconnecting line electrical connection.

After electroplating or electroless plating Cu or Cu alloy on the metal layer 20, to form the plating layer 15, CMP is typically performed to provide a thinner planarized upper surface (not shown). Cu metallization interconnection line is formed in trench 12, while a dual damascene Cu metallization structure is formed through via 13A connected to trench 13B.

Embodiments of the present invention, although not illustrated, include electroless plating or electroplating various Cu alloys, such as alloys of Cu with Mg, Zn, zirconium (Zr), Sn, nickel (Ni), or palladium (Pd), on the surface of the metal layer 20. A seed layer is deposited on the metal layer for enhanced nucleation and adhesion of the electroplated or electroless plated Cu or Cu alloy layer. The seed layer can comprise an alloy of Cu and any of various alloying elements such as Mg, Al, Zn, Zr, Sn, Ni, Pd, silver (Ag), or gold (Au). The seed layer can be sputter deposited or deposited by CVD.

In accordance with the present invention, Cu metallization structures are formed in an elegantly simply, efficient and cost-effective manner. Advantageously, the dual layer protective barrier prevents corrosion of the Cu metallization and prevents diffusion of Cu atoms from the Cu metallization through the dielectric layer into the silicon elements. The dual layer protective barrier Cu metallization formed in accordance with the present invention is particularly advantageous in forming inlaid Cu metallization interconnection patterns, particularly in various types of semiconductor devices having sub-micron features and high aspect ratio openings.

In the previous descriptions, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming an opening in a dielectric layer;

forming a nitride layer lining the opening and on the dielectric layer with a plasma generated in a chamber comprising a target while preventing atoms sputtered from the target from impinging on the dielectric layer; and, sputter depositing a metal nitride layer on the nitride layer in the chamber by permitting atoms sputtered from the target to impinge on the nitride layer, wherein the nitride layer and the metal nitride layer are formed in the same chamber.

2. The method of claim 1, wherein the chamber further comprises a shutter having an aperture.

3. The method of claim 2, comprising closing the aperture of the shutter to prevent the sputtered atoms from impinging on the dielectric layer during formation of the nitride layer.

4. The method of claim 2, comprising opening the aperture of the shutter to permit the sputtered atoms to impinge the dielectric layer during deposition of the metal nitride layer.

5. The method of claim 1, further comprising introducing an argon/nitrogen gas mixture into the chamber before or during formation of the nitride layer.

6. The method according to claim 1, wherein the nitride layer comprises an oxynitride.

7. The method according to claim 6, wherein the oxynitride comprises silicon oxynitride.

8. The method according to claim 1, comprising forming the nitride layer to a thickness less than about 5 nm.

9. The method according to claim 8, comprising forming the nitride layer to a thickness less than about 3 nm.

10. The method according to claim 1, comprising sputter depositing the metal nitride layer to a thickness of about 25 Å to about 500 Å.

11. The method according to claim 10, comprising sputter depositing the metal nitride layer to a thickness of about 50 Å to about 100 Å.

12. The method according to claim 1, wherein the dielectric layer comprises silicon oxide.

13. The method according to claim 1, further comprising:

electroless plating or electroplating Cu or a Cu alloy on an upper surface of the metal layer and filling the opening; and, planarizing the upper surface of the Cu or Cu alloy by chemical-mechanical polishing.

14. The method according to claim 13, further comprising:

depositing a seed layer on the metal nitride layer before electroless plating or electroplating the Cu or Cu alloy.

15. The method according to claim 1, wherein the opening comprises a trench.

16. The method according to claim 15, wherein the opening further comprises a via or contact hole section communicating with the trench.

\* \* \* \* \*